(12) United States Patent
Park et al.

(10) Patent No.: US 11,715,711 B2
(45) Date of Patent: Aug. 1, 2023

(54) MEMORY DEVICE INCLUDING PASS TRANSISTORS

(71) Applicant: SK hynix Inc., Icheon-si (KR)

(72) Inventors: Tae Sung Park, Icheon-si (KR); Jin Ho Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 187 days.

(21) Appl. No.: 17/151,464

(22) Filed: Jan. 18, 2021

(65) Prior Publication Data

US 2022/0059480 A1    Feb. 24, 2022

(30) Foreign Application Priority Data

Aug. 18, 2020  (KR) .......................... 10-2020-0103002

(51) Int. Cl.
| | |
|---|---|
| *H01L 23/00* | (2006.01) |
| *H01L 25/065* | (2023.01) |
| *H01L 25/18* | (2023.01) |
| *H10B 41/27* | (2023.01) |
| *H10B 43/27* | (2023.01) |

(52) U.S. Cl.
CPC .......... *H01L 24/08* (2013.01); *H01L 25/0657* (2013.01); *H01L 25/18* (2013.01); *H10B 41/27* (2023.02); *H10B 43/27* (2023.02); *H01L 2224/08145* (2013.01); *H01L 2924/1431* (2013.01); *H01L 2924/14511* (2013.01)

(58) Field of Classification Search
CPC ..... H01L 24/08; H01L 25/0657; H01L 25/18; H01L 27/11556; H01L 27/11582; H01L 2224/08145; H01L 2924/1431; H01L 2924/14511; H10B 41/27; H10B 43/27; H10B 80/00
See application file for complete search history.

(56) References Cited

U.S. PATENT DOCUMENTS

| | | | | |
|---|---|---|---|---|
| 2012/0236619 A1* | 9/2012 | Kutsukake | ............. | H10B 41/41 365/72 |
| 2014/0369121 A1* | 12/2014 | Kim | ...................... | H01L 27/088 365/185.11 |
| 2021/0065799 A1* | 3/2021 | Kim | ...................... | G11C 5/025 |

FOREIGN PATENT DOCUMENTS

KR    1020120115011 A    10/2012

* cited by examiner

*Primary Examiner* — Benjamin Tzu-Hung Liu

(57) ABSTRACT

A memory device includes an active region with a drain; a plurality of memory blocks arranged in a first direction; and a plurality of pass transistors formed in the active region and sharing the drain, each one of the plurality of pass transistors configured to transfer an operating voltage from the drain to a corresponding one of the plurality of memory blocks in response to a block select signal. The plurality of pass transistors is divided into first pass transistors and second pass transistors. A channel length direction of the first pass transistors and a channel length direction of the second pass transistors are different from each other.

18 Claims, 13 Drawing Sheets

FIG.6
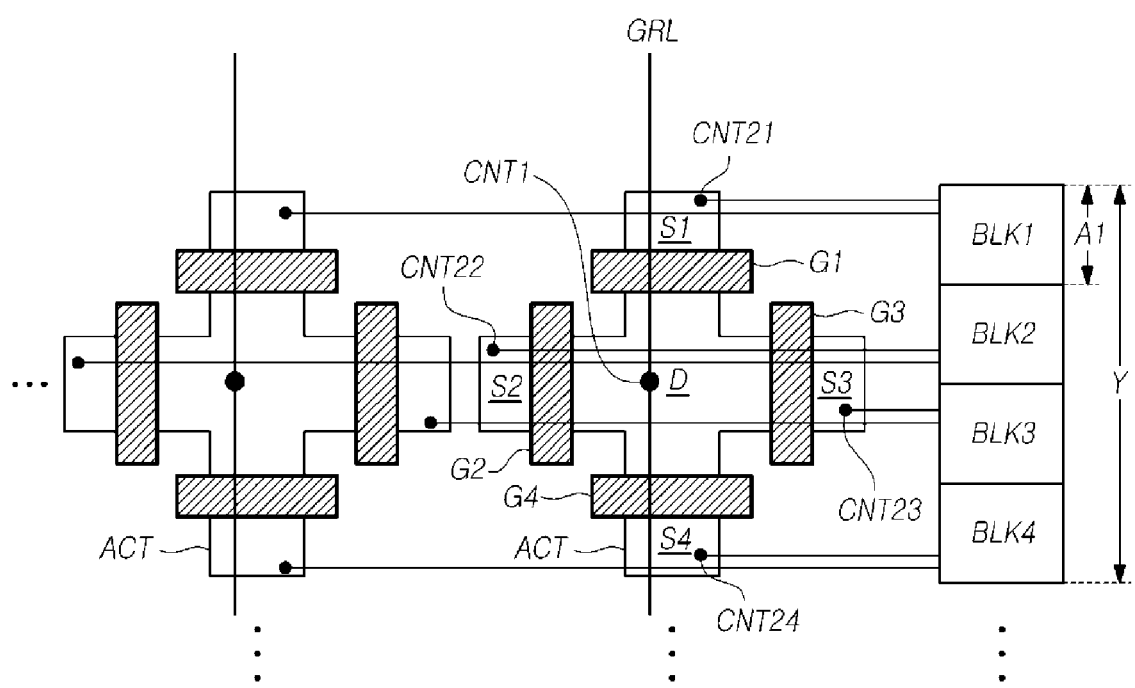
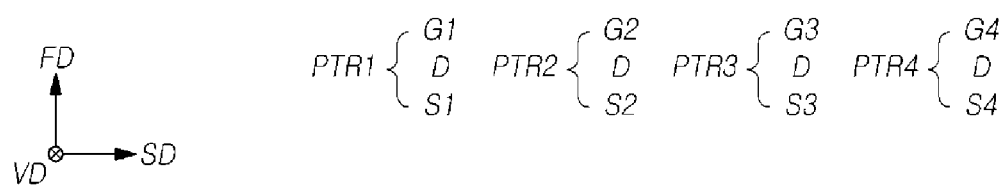

FIG.8
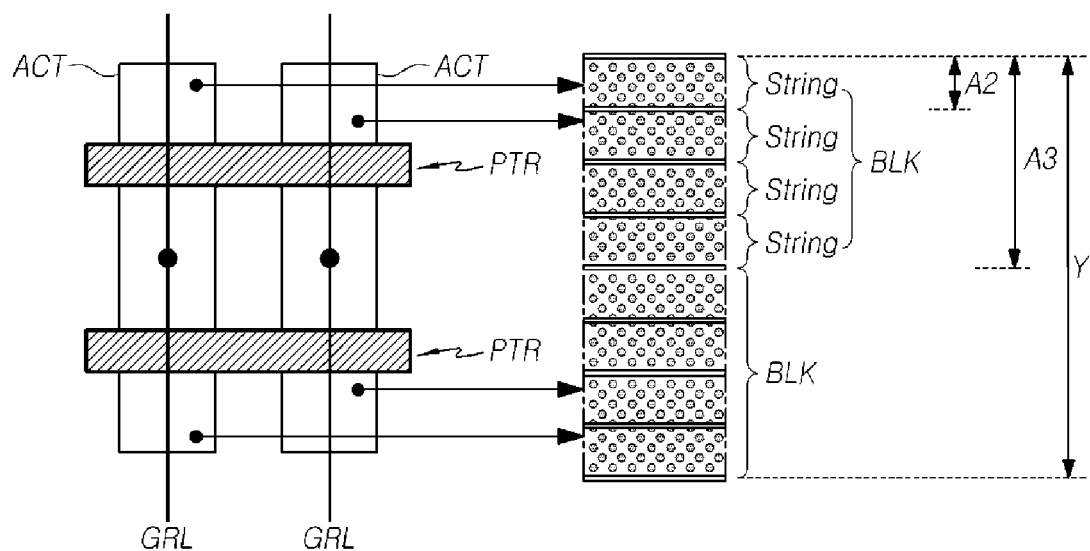
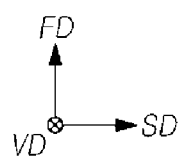

MEMORY DEVICE INCLUDING PASS TRANSISTORS

CROSS-REFERENCE TO RELATED APPLICATION

The present application claims priority under 35 U.S.C. § 119(a) to Korean Patent Application No. 10-2020-0103002 filed in the Korean Intellectual Property Office on Aug. 18, 2020, which is incorporated herein by reference in its entirety.

BACKGROUND

1. Technical Field

Various embodiments generally relate to a semiconductor technology, and more particularly, to a memory device that includes pass transistors.

2. Related Art

A volatile memory device has high write and read speeds, but may lose data stored therein if power supply is interrupted. A nonvolatile memory device has relatively low write and read speeds, but may retain data stored therein even though power supply is interrupted. Therefore, in order to store data that should be retained regardless of power supply, a nonvolatile memory device may be used. Nonvolatile memory devices include a read only memory (ROM), a mask ROM (MROM), a programmable ROM (PROM), an erasable programmable ROM (EPROM), an electrically erasable and programmable ROM (EEPROM), a flash memory, a phase change random access memory (PRAM), a magnetic RAM (MRAM), a resistive RAM (RRAM), and a ferroelectric RAM (FRAM). Flash memories may be divided into NOR type memories and NAND type memories.

Among the nonvolatile memory devices, a NAND flash memory device is widely used as a data storage device. The NAND flash memory device may transfer operating voltages to memory cells through pass transistors.

SUMMARY

Various embodiments are directed to measures capable of contributing to improving the performance of a memory device and reducing the size thereof.

In an embodiment, a memory device may include: an active region with a drain; a plurality of memory blocks arranged in a first direction; and a plurality of pass transistors formed in the active region and sharing the drain, each one of the plurality of pass transistors configured to transfer an operating voltage from the drain to a corresponding one of the plurality of memory blocks in response to a block select signal. The plurality of pass transistors is divided into first pass transistors and second pass transistors. A channel length direction of the first pass transistors and a channel length direction of the second pass transistors may be different from each other.

The channel length direction of the first pass transistors may be the first direction, and the channel length direction of the second pass transistors may be a second direction that intersects with the first direction.

In an embodiment, a memory device may include: four memory blocks arranged in a first direction; and four pass transistors configured to selectively transfer an operating voltage to any one of the four memory blocks in response to a block select signal. The four pass transistors may include: first to fourth gates formed on extended portions, respectively, of a cross-shaped active region that extends in the first direction and in a second direction intersecting with the first direction; a drain formed in a center portion of the active region which is surrounded by the first to fourth gates and that is configured to receive the operating voltage; and first to fourth sources formed in end portions, respectively, of the extended portions of the active region and coupled to the memory blocks respectively corresponding thereto, and configured to output the operating voltage to the corresponding memory blocks.

In an embodiment, a memory device may include: a substrate; and four pass transistors defined on the substrate, and including a common drain, four gates that are disposed around the common drain and four sources that are disposed opposite the common drain with respect to the four gates. The four pass transistors may be configured in one active region, which is defined in the substrate.

BRIEF DESCRIPTION OF THE DRAWINGS

FIG. 6 is a layout diagram illustrating a representation of pass transistors in accordance with an embodiment of the disclosure.

FIG. 8 is a layout diagram illustrating a representation of pass transistors and memory blocks of a memory device related to the disclosure.

DETAILED DESCRIPTION

Figure 1:
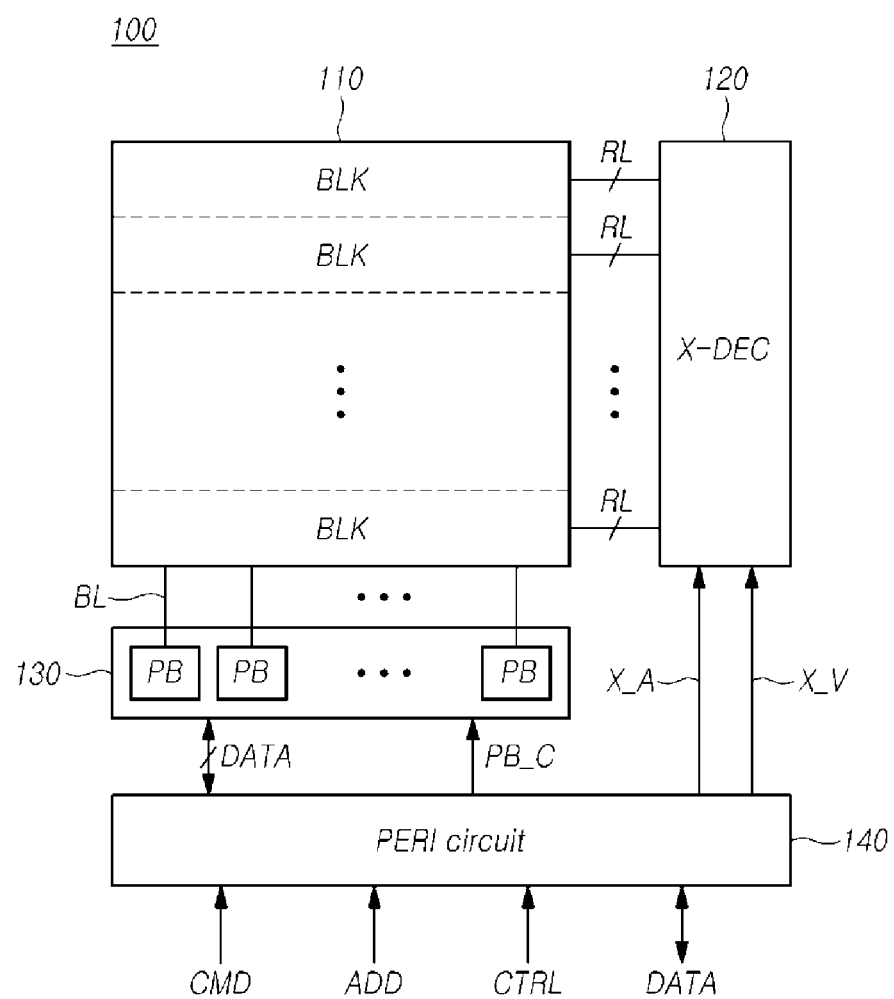
FIG. 1 is a block diagram illustrating a representation of a memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram illustrating a representation of a memory device in accordance with an embodiment of the disclosure.

Referring to FIG. 1, a memory device 100 in accordance with an embodiment of the disclosure may include a memory cell array 110 and a logic circuit for controlling the memory cell array 110. The logic circuit may include a row decoder (X-DEC) 120, a page buffer circuit 130 and a peripheral circuit (PERI circuit) 140.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, which are coupled in series.

Each of the memory blocks BLK may be coupled to the row decoder 120 through row lines RL. The row lines RL may include select lines and a plurality of word lines. The select lines may include drain select lines and source select lines.

The row decoder 120 may select any one from among the memory blocks BLK included in the memory cell array 110, in response to a row address X_A provided from the peripheral circuit 140. The row decoder 120 may select any one from among the word lines of a selected memory block. The row decoder 120 may transfer an operating voltage X_V, provided from the peripheral circuit 140, to a word line or select lines of the selected memory block. In particular, a high voltage should be provided to word lines of the selected memory block. In order to transfer the high voltage, the row decoder 120 may include pass transistors that are configured by high-voltage transistors.

The page buffer circuit 130 may be coupled to the memory cell array 110 through a plurality of bit lines BL. The page buffer circuit 130 may include a plurality of page buffers PB, which are coupled to the bit lines BL, respectively. The page buffer circuit 130 may receive a page buffer control signal PB_C from the peripheral circuit 140, and may transmit and receive a data signal DATA to and from the peripheral circuit 140. The page buffer circuit 130 may control the bit lines BL, which are arranged in the memory cell array 110, in response to the page buffer control signal PB_C. For example, the page buffer circuit 130 may detect data, stored in a memory cell of the memory cell array 110, by sensing the signal of a bit line BL of the memory cell array 110 in response to the page buffer control signal PB_C, and may transmit the data signal DATA to the peripheral circuit 140 depending on the detected data. The page buffer circuit 130 may apply a signal to a bit line BL based on the data signal DATA, received from the peripheral circuit 140, in response to the page buffer control signal PB_C, and thereby, may write data in a memory cell of the memory cell array 110. The page buffer circuit 130 may write data in or read data from memory cells, which are coupled to a selected word line.

The peripheral circuit 140 may receive a command signal CMD, an address signal ADD and a control signal CTRL from outside the memory device 100, and may transmit and receive data DATA to and from a device outside the memory device 100, for example, a memory controller. The peripheral circuit 140 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 140 may generate various voltages including the operating voltage X_V, which are required in the memory device 100.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a vertical direction VD. For example, the first direction FD may correspond to the extending direction of bit lines, and the second direction SD may correspond to the extending direction of word lines. The first direction FD and the second direction SD may substantially perpendicularly intersect with each other. In the drawings, a direction indicated by an arrow and a direction opposite thereto represent the same direction.

Although, in the present specification, a case where the memory device 100 is a flash memory is described as an example, the type of a memory is not limited thereto, and the technical spirit of the disclosure may be applied to other memories in addition to flash memories.

Figure 2:
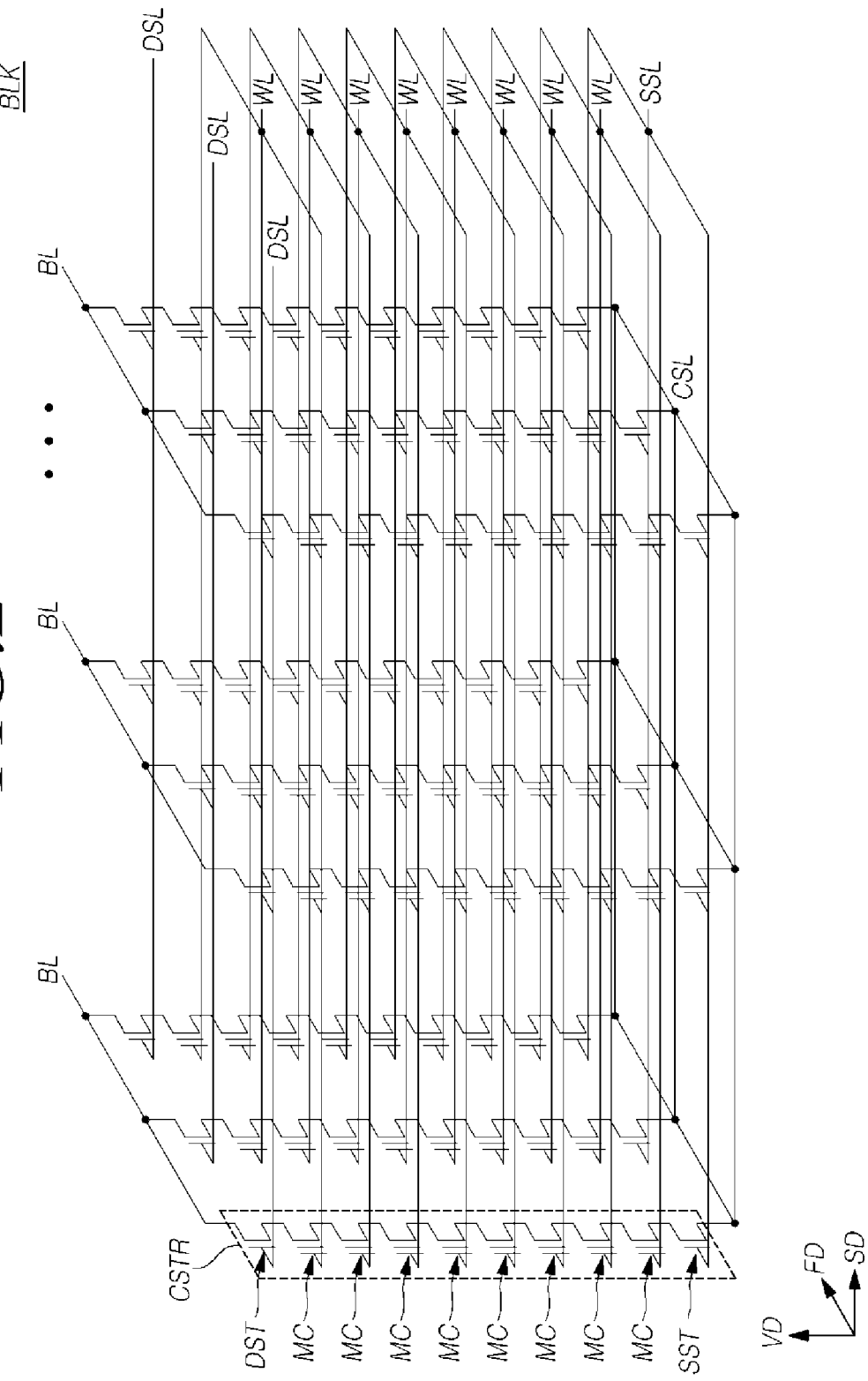
FIG. 2 is an equivalent circuit diagram illustrating a representation of a memory block illustrated in FIG. 1.

FIG. 2 is an equivalent circuit diagram illustrating a representation of a memory block BLK illustrated in FIG. 1.

Referring to FIG. 2, a memory block BLK may include a plurality of cell strings CSTR, which are coupled between a plurality of bit lines BL and a common source line CSL. The bit lines BL may extend in the first direction FD, and may be arranged in the second direction SD. A plurality of cell strings CSTR may be coupled in parallel to each of the bit lines BL. The cell strings CSTR may be coupled in common to the common source line CSL. The plurality of cell strings CSTR may be coupled between the plurality of bit lines BL and the one common source line CSL.

Each of the cell strings CSTR may include a drain select transistor DST, which is coupled to the bit line BL, a source select transistor SST, which is coupled to the common source line CSL, and a plurality of memory cells MC, which are coupled between the drain select transistor DST and the source select transistor SST. The drain select transistor DST, the memory cells MC and the source select transistor SST may be coupled in series in the vertical direction VD.

Drain select lines DSL, a plurality of word lines WL and a source select line SSL may be stacked between the bit lines BL and the common source line CSL in the vertical direction VD. Each of the drain select lines DSL may be coupled to the gates of corresponding drain select transistors DST. Each of the word lines WL may be coupled to the gates of corresponding memory cells MC. The source select line SSL may be coupled to the gates of source select transistors SST. Memory cells MC that are coupled in common to one word line WL may configure one page.

Figure 3:
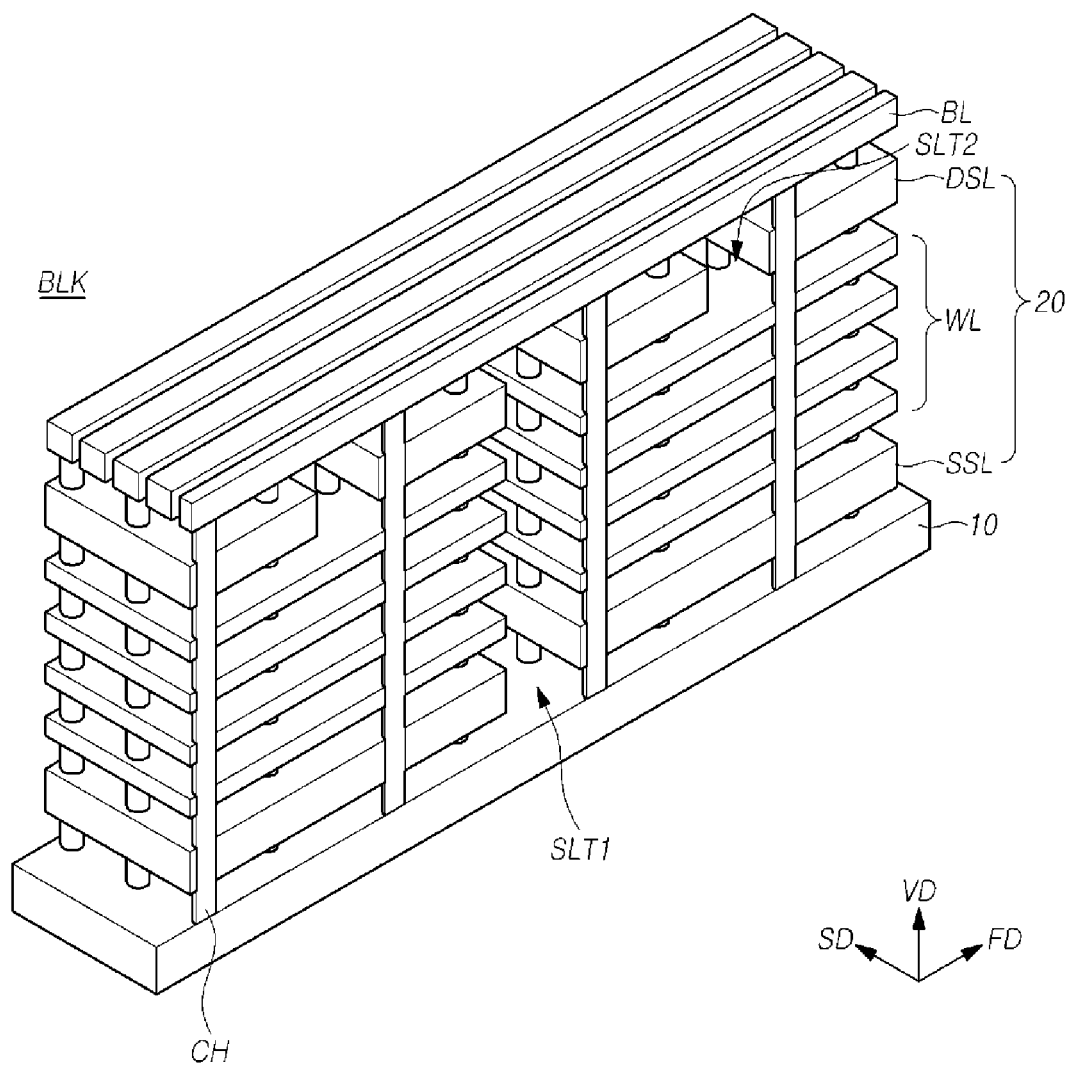
FIG. 3 is a perspective view illustrating a representation of a memory block illustrated in FIG. 1.

FIG. 3 is a perspective view illustrating a representation of a memory block illustrated in FIG. 1.

Referring to FIG. 3, a plurality of electrode layers 20 may be stacked on a substrate 10 in the vertical direction VD to be spaced apart from one another. Although not illustrated, interlayer dielectric layers may be defined on and under the plurality of electrode layers 20. The interlayer dielectric layers may be stacked alternately with the plurality of electrode layers 20 in the vertical direction VD.

The electrode layers 20 may include a conductive material. For example, the electrode layers 20 may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). Among the electrode layers 20, at least one electrode layer 20 from the lowermost electrode layer 20 may configure a source select line SSL. Among the electrode layers 20, at least one electrode layer 20 from the uppermost electrode layer 20 may configure a drain select line DSL. The electrode layers 20 between the source select line SSL and the drain select line DSL may configure word lines WL.

A plurality of vertical channels CH that pass through the plurality of electrode layers 20 in the vertical direction VD may be defined on the substrate 10. Each of the vertical channels CH may include a channel layer and a gate dielectric layer. The channel layer may include polysilicon or monocrystalline silicon, and may include, in some regions thereof, a p-type impurity such as boron (B). The channel layer may have the shape of a pillar that is completely filled up to its center, or a solid cylinder shape. While not illustrated, the channel layer may have the shape of a tube whose center region is open. In this case, a buried dielectric layer may be formed in the open center region of the channel layer. The gate dielectric layer may have the shape of a straw or a cylindrical shell that surrounds the outer wall of the channel layer. Although not illustrated, the gate dielectric layer may include a tunnel dielectric layer, a charge storage layer and a blocking layer, which are sequentially stacked from the outer wall of the channel layer. The gate dielectric layer may have an ONO (oxide-nitride-oxide) stack structure in which an oxide layer, a nitride layer and an oxide layer are sequentially stacked.

A source select transistor may be formed in areas or regions where the source select line SSL surrounds the vertical channel CH. A drain select transistor may be formed in areas or regions where the drain select line DSL surrounds the vertical channel CH. A memory cell may be formed in areas or regions where the word line WL surround the vertical channel CH.

A plurality of first slits SLT1 may divide the source select line SSL, the drain select line DSL and the word lines WL to form line segments between adjacent first slits SLT1. The first slits SLT1 may extend in the second direction SD and the vertical direction VD, and may be arranged in the first direction FD.

A second slit SLT2 that divides a segment of the drain select line DSL may be formed between adjacent first slits SLT1. Between adjacent first slits SLT1, segments of the source select line SSL and the word lines WL may be divided into units of memory blocks or sub-blocks. Between adjacent first slits SLT1, the drain select line DSL may be further divided by the second slit SLT2 into units each smaller than a memory block or a sub-block, such as for example, units of strings.

A plurality of bit lines BL, which are coupled to the vertical channels CH, may be defined over the drain select line DSL. The bit lines BL may extend in the first direction FD, and may be arranged in the second direction SD.

Figure 4:
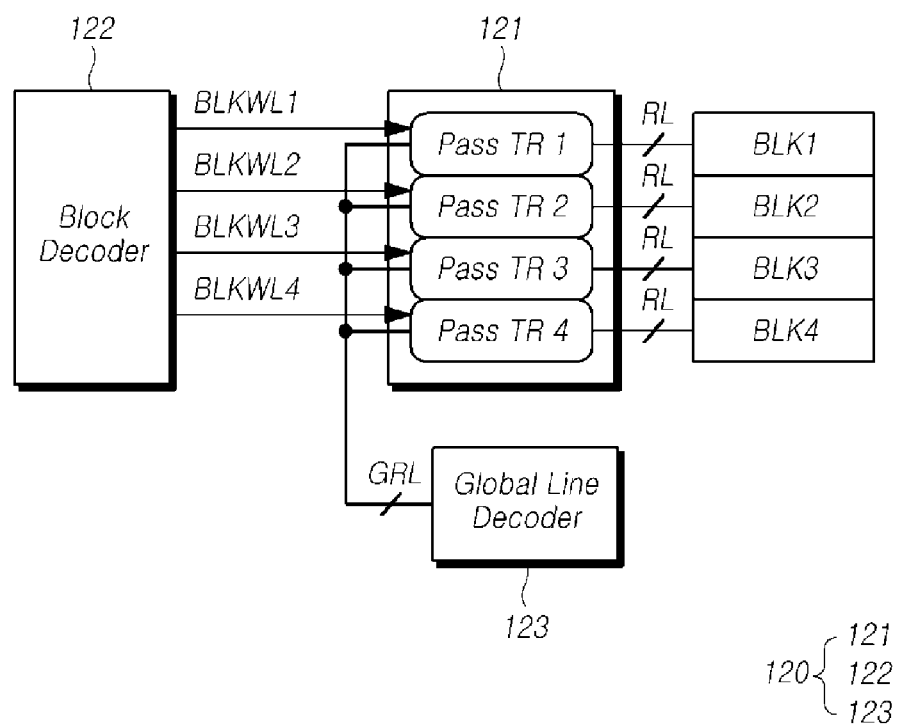
FIG. 4 is a block diagram illustrating a representation of a row decoder in accordance with an embodiment of the disclosure.

FIG. 4 is a block diagram illustrating a representation of a row decoder in accordance with an embodiment of the disclosure. FIG. 4 illustrates a structure for driving, for example, four memory blocks BLK1 to BLK4.

Referring to FIG. 4, a row decoder 120 may include a pass transistor circuit 121, a block decoder 122 and a global line decoder 123.

The pass transistor circuit 121 may include a plurality of pass transistor groups Pass TR 1 to Pass TR 4 corresponding to the plurality of memory blocks BLK1 to BLK4, respectively. Each of the plurality of pass transistor groups Pass TR 1 to Pass TR 4 may be coupled to a corresponding memory block through a plurality of row lines RL.

The block decoder 122 may activate one of a plurality of block select signals BLKWL1 to BLKWL4 in response to a block address (not illustrated). One of the pass transistor groups Pass TR 1 to Pass TR 4 may be selected by the activated block select signal. For instance, when the block select signal BLKWL1 is activated, the pass transistor group Pass TR 1 may be selected.

The global line decoder 123 may be coupled to the plurality of pass transistor groups Pass TR 1 to Pass TR 4 through a plurality of global row lines GRL. Each of the pass transistor groups Pass TR 1 to Pass TR 4 may be coupled to the plurality of global row lines GRL. The plurality of global row lines GRL may be coupled in common to the pass transistor groups Pass TR 1 to Pass TR 4. Due to this fact, the pass transistor groups Pass TR 1 to Pass TR 4 may share the plurality of global row lines GRL.

The global line decoder 123 may be provided with operating voltages from a peripheral circuit (140 of FIG. 1), and may transfer the operating voltages to the global row lines GRL in response to a control signal from the peripheral circuit.

One pass transistor group selected from among the pass transistor groups Pass TR 1 to Pass TR 4, that is, a pass transistor group provided with a block select signal and which is activated, may transfer the operating voltages, provided to the global row lines GRL, to a corresponding memory block through the row lines RL.

Figure 5:
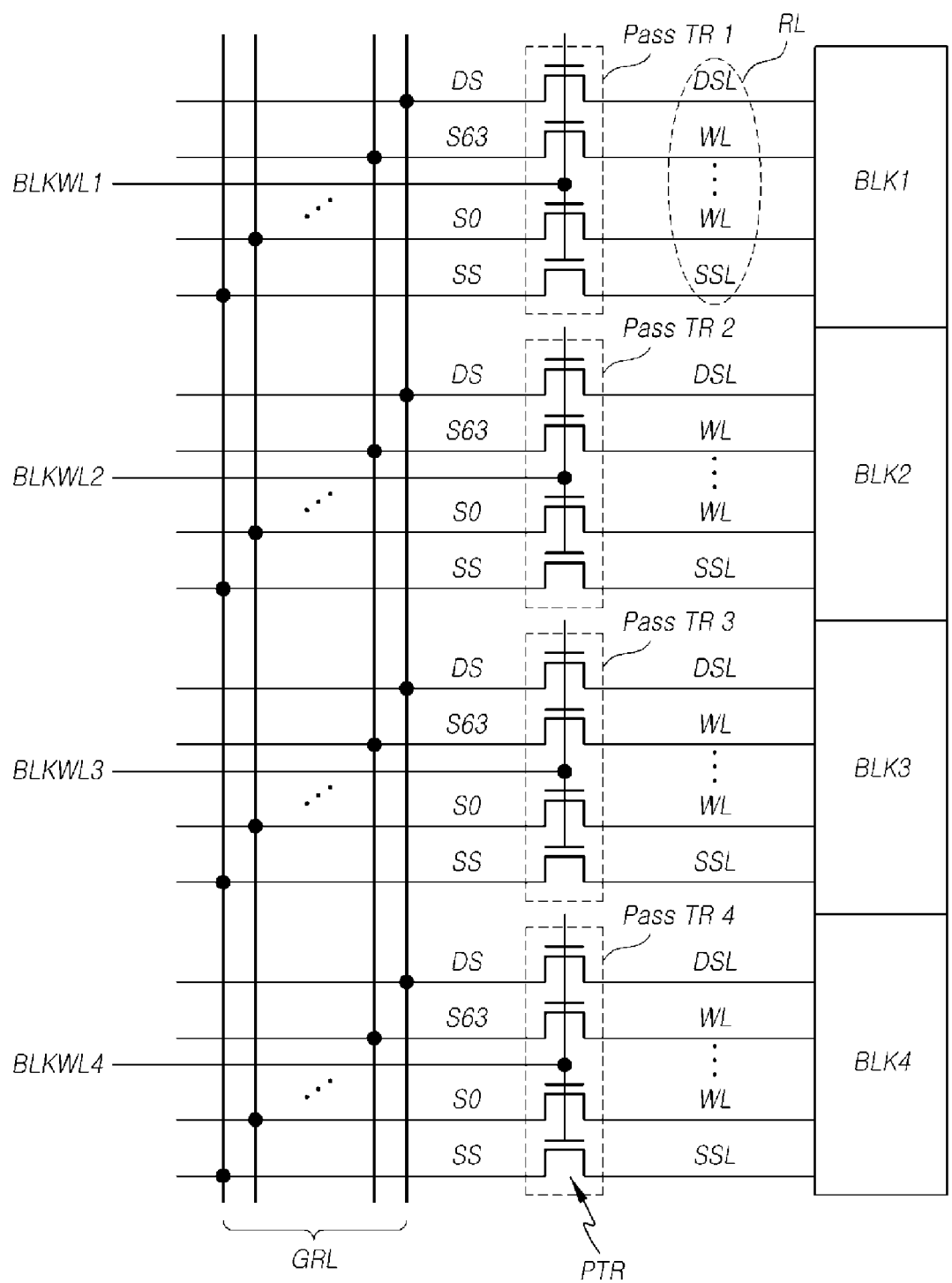
FIG. 5 is a circuit diagram illustrating a representation of pass transistor groups illustrated in FIG. 4.

FIG. 5 is a circuit diagram illustrating a representation of pass transistor groups illustrated in FIG. 4.

Referring to FIG. 5, each of the pass transistor groups Pass TR 1 to Pass TR 4 may include a plurality of pass transistors PTR. Sources of the pass transistors PTR included in each of the pass transistor groups Pass TR 1 to Pass TR 4 may be coupled to the row lines RL, respectively, of a corresponding memory block. Drains of the pass transistors PTR included in each of the pass transistor groups Pass TR 1 to Pass TR 4 may be coupled to the global row lines GRL, respectively.

Pass transistors PTR included in a single pass transistor group (one of Pass TR 1 to Pass TR 4) may be coupled to different global row lines GRL. Gates of the pass transistors PTR included in the single pass transistor group (one of Pass TR 1 to Pass TR 4) may be coupled to one another, and may be provided with the same block select signal from the block decoder 121. Due to this fact, the pass transistors PTR included in the single pass transistor group (one of Pass TR 1 to Pass TR 4) may be turned on or turned off at once or together.

For instance, when the memory block BLK1 is selected, the block select signal BLKWL1 is activated. In response to the activated block select signal BLKWL1, all the pass transistors PTR included in the pass transistor group Pass TR 1 are turned on. Operating voltages SS, S0 to S63 and DS provided to the global row lines GRL are transferred to the row lines RL of the memory block BLK1 through the pass transistors PTR of the pass transistor group Pass TR 1.

Four pass transistors PTR may be coupled in common to each of the global row lines GRL. The four pass transistors PTR that are coupled in common to one global row line GRL may be included in different pass transistor groups. As will be described later with reference to FIG. 6, the four pass transistors PTR that are coupled in common to one global row line GRL may share one drain, and that global row line GRL may be coupled to the one drain.

Operating voltages applied to word lines WL among the row lines RL may include a program voltage (Vpgm), an unselect read voltage (Vread), a read voltage (Vrd), a pass voltage (Vpass) and a verify voltage (Vfy). The unselect read voltage (Vread) means a voltage that is provided to an unselected word line during a read operation. The read voltage (Vrd) means a voltage that is provided to a selected word line during the read operation.

The program voltage (Vpgm), the pass voltage (Vpass) or the unselect read voltage (Vread) each corresponds to a relatively high voltage. In order to transfer a high voltage, pass transistors are configured by high-voltage transistors. A channel of a high-voltage transistor should be formed to have a length longer than that of a low-voltage transistor so as to withstand a high voltage, that is, to prevent a punch-through between a source and a drain. Therefore, the high-voltage transistor requires a wider area than the low-voltage transistor. For this reason, pass transistors for transferring a high voltage each have a relatively larger size compared to low-voltage transistors.

A memory device performs write and read operations on a page basis, and performs an erase operation on a memory block basis. Speeds of the respective operations are different from one another. For example, the speed of a read operation is about 25 microseconds (µs), the speed of a write operation is about 250 µs, and the speed of an erase operation is about 2,000 µs. Thus, the speeds of the respective operations are asymmetric. In particular, the speed of the erase operation is much slower than the speeds of the read operation and the write operation. The speed of the erase operation decreases as the size of a memory block increases. A slow erase operation is a cause of degradation in the performance of the memory device.

If a size of a memory block increases, then the number of cell strings included in a single memory block increases, and accordingly, parasitic capacitance between row lines and cell strings may increase, thereby degrading the performance of a memory device. If the number of stacked row lines (word lines) is increased to increase the degree of integration, the problem of increased parasitic capacitance may become more serious. Therefore, in order to improve the performance of the memory device, it is necessary to reduce a memory size.

In order to reduce a delay time induced during a process in which an operating voltage from a pass transistor is transferred to a memory block, and in order to prevent the size of a memory device from increasing due to the presence of pass transistors, the memory block needs to be disposed and sized in conformity with the disposition of corresponding pass transistors. However, because a pass transistor should have a long channel length to withstand a high voltage, it is not easy to reduce the size of the memory block. Embodiments of the disclosure may suggest measures capable of reducing the size of a memory block through a change in the disposition of pass transistors.

FIG. 6 is a layout diagram illustrating a representation of pass transistors in accordance with an embodiment of the disclosure.

Referring to FIG. 6, a plurality of active regions ACT may be arranged in the second direction SD. First to fourth pass transistors PTR1 to PTR4 may be configured in each of the active regions ACT.

In detail, each of the active regions ACT may have a cross shape with arms that extend in the first direction FD and the second direction SD. First to fourth gates G1 to G4 may be disposed on extended portions, respectively, of the active region ACT.

The first gate G1 and the fourth gate G4 may be disposed parallel to each other while traversing, in the second direction SD, the extended portions of the active region ACT, which extend in the first direction FD. The second gate G2 and the third gate G3 may be disposed parallel to each other while traversing, in the first direction FD, the extended portions of the active region ACT, which extend in the second direction SD.

A drain D may be formed in a center portion of the active region ACT. The drain D is surrounded by the first to fourth gates G1 to G4. First to fourth sources S1 to S4 may be formed in end portions, respectively, of the extended arms of the active region ACT. The first to fourth sources S1 to S4 are positioned opposite the drain D with respect to the first to fourth gates G1 to G4, respectively.

A contact CNT1 may be coupled to the drain D. A global row line GRL may be defined on the contact CNT1, and may be coupled to the contact CNT1. The drain D may be coupled to the global row line GRL through the contact CNT1.

Contacts CNT21 to CNT24 may be coupled to the first to fourth sources S1 to S4, respectively. The contacts CNT21 to CNT24 may be coupled to first to fourth memory blocks BLK1 to BLK4, respectively, through wiring lines.

The first gate G1, the drain D and the first source S1 may configure the first pass transistor PTR1 for transferring an operating voltage to the first memory block BLK1. The second gate G2, the drain D and the second source S2 may configure the second pass transistor PTR2 for transferring an operating voltage to the second memory block BLK2. The third gate G3, the drain D and the third source S3 may configure the third pass transistor PTR3 for transferring an operating voltage to the third memory block BLK3. The fourth gate G4, the drain D and the fourth source S4 may configure the fourth pass transistor PTR4 for transferring an operating voltage to the fourth memory block BLK4.

A channel length direction of the first pass transistor PTR1 and the fourth pass transistor PTR4, and a channel length direction of the second pass transistor PTR2 and the third pass transistor PTR3, may be different from each other. For example, the first pass transistor PTR1 and the fourth pass transistor PTR4 may be laid out such that they share the drain D and such that the channel length direction of both transistors is the first direction FD, and the second pass transistor PTR2 and the third pass transistor PTR3 may be laid out such that they share the drain D and such that the channel length direction of both transistors is the second direction SD.

The length of each of the pass transistors PTR1 to PTR4, in the channel length direction, may satisfy a requirement of a high-voltage transistor, that is, a length that reflects a transistor size capable of satisfying a high breakdown voltage characteristic. In detail, the length of the first pass transistor PTR1 in the first direction FD and the length of the fourth pass transistor PTR4 in the first direction FD may each have a magnitude or size suitable for the requirements of a high-voltage transistor. The length of the second pass transistor PTR2 in the second direction SD and the length of the third pass transistor PTR3 in the second direction SD also may each have a magnitude or size suitable for the requirements of a high-voltage transistor.

Dimension Y of FIG. 6 represents the greatest distance, in the first direction FD, between two pass transistors that are arranged in a line in the first direction FD and that have the first direction FD as a channel length direction. Hereinafter, for the sake of convenience in explanation, the dimension Y will be defined as a first pitch Y.

Within the first pitch Y, the first pass transistor PTR1 and the fourth pass transistor PTR4 may be laid out or arranged in the first direction FD. Within the first pitch Y, the second pass transistor PTR2 and the third pass transistor PTR3 may be laid out or arranged in the second direction SD. The four pass transistors PTR1 to PTR4, which share one global row line GRL, may be laid out within the first pitch Y. Separately, the pass transistors PTR1 to PTR4, which share one global row line GRL, may be included in different pass transistor groups and may correspond to different memory blocks.

The first to fourth memory blocks BLK1 to BLK4, corresponding to the first to fourth pass transistors PTR1 to PTR4, may be arranged in the first direction FD. In order to reduce a delay time that results when an operating voltage from a pass transistor is transferred to a memory block, and in order to prevent the size of a memory device from increasing due to the presence of pass transistors, a memory block needs to be disposed and sized in conformity with the disposition of corresponding pass transistors. Therefore, the first to fourth memory blocks BLK1 to BLK4 need to be disposed within the first pitch Y and need to be sized based on the first pitch Y. Accordingly, in an example, a pitch A1 of each of the first to fourth memory blocks BLK1 to BLK4 in the first direction FD has a size corresponding to one-fourth (¼) of the first pitch Y.

The first to fourth memory blocks BLK1 to BLK4 may be configured on the same substrate as the first to fourth pass transistors PTR1 to PTR4. In this case, the memory device may be defined as having a planar structure. Although embodiments to be described below with reference to FIG. 7 illustrates the first to fourth memory blocks BLK1 to BLK4 and the first to fourth pass transistors PTR1 to PTR4 as planarly disposed on a single substrate, it is to be noted that the disclosure is not limited thereto.

Figure 7:
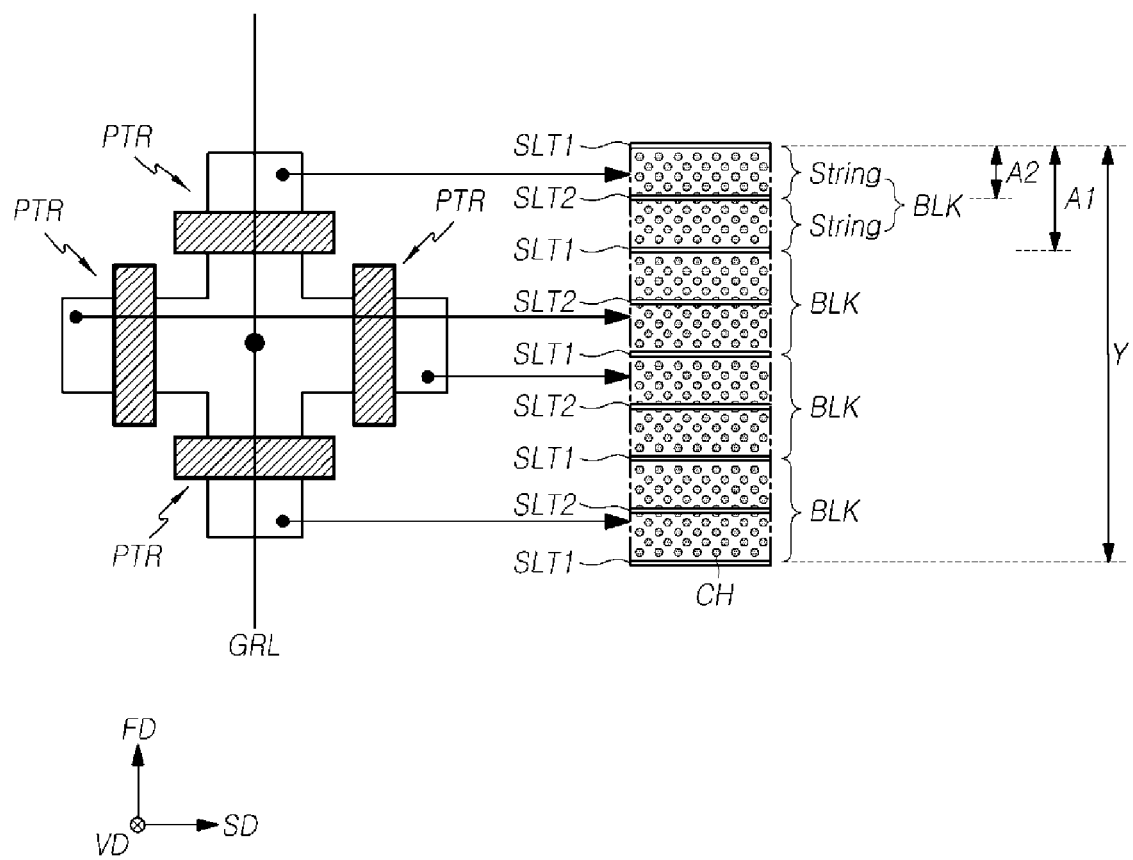
FIG. 7 is a layout diagram illustrating a representation of structures of the memory blocks illustrated in FIG. 6.

FIG. 7 is a layout diagram illustrating a representation of structures of the memory blocks illustrated in FIG. 6.

Referring to FIG. 7, four memory blocks BLK are disposed within the first pitch Y. As described above with reference to FIG. 3, each of the memory blocks BLK may include a source select line SSL, a plurality of word lines WL and a drain select line DSL, which are stacked in the vertical direction VD, and a plurality of vertical channels CH that pass through the source select line SSL, the plurality of word lines WL and the drain select line DSL in the vertical direction VD.

First slits SLT, which divide the source select line SSL, the drain select line DSL and the word lines WL, may be formed, and second slits SLT2, each of which divides the drain select line DSL between adjacent first slits SLT1, may be formed. The drain select line DSL may be divided into units of strings by the first slits SLT1 and the second slit SLT2. For instance, a pitch A2 of one string in the first direction FD may have a size corresponding to one-eighth (⅛) of the first pitch Y. With four memory blocks BLK configured within the first pitch Y, each of the memory blocks BLK may have a two-string structure and may include two strings. In this example, a pitch A1 of each of the memory blocks BLK in the first direction FD may have a size corresponding to twice the pitch A2 of one string in the first direction FD.

FIG. 8 is a layout diagram illustrating a representation of pass transistors and memory blocks of a memory device related to the disclosure.

Referring to FIG. 8, a plurality of active regions ACT may be arranged in the second direction SD. Each of the active regions ACT may have a line shape that extends in the first direction FD.

Each of pass transistors PTR may be provided as one of two high-voltage transistors that are formed in each one of the active regions ACT. The two pass transistors PTR, which have a channel length direction in the first direction FD and are formed in one active region ACT, may be laid out such that they share a drain within a first pitch Y.

Because a memory block needs to be disposed and sized in conformity with the disposition of corresponding pass transistors, two memory blocks BLK are configured within the first pitch Y in correspondence to the two pass transistors PTR, which are disposed within the first pitch Y and share one global row line GRL. Accordingly, a pitch A3 of each of the memory blocks BLK in the first direction FD has a size corresponding to one-half (½) of the first pitch Y.

For instance, in the case where a pitch A2 of one string in the first direction FD has a size corresponding to ⅛ of the first pitch Y, each of the memory blocks BLK may have a four-string structure that includes four strings. The pitch A3 of each of the memory blocks BLK in the first direction FD may have a size corresponding to four times the pitch A2 of one string in the first direction FD.

In contrast to the comparative example described above with reference to FIG. 8, according to embodiments of the disclosure described above with reference to FIG. 7, a memory block may be configured to have a smaller size. As aforementioned, if a size of a memory block increases, the speed of an erase operation may decrease, the number of cell strings included in a single memory block may increase, and accordingly, parasitic capacitance between row lines and cell strings may increase, thereby degrading the performance of a memory device.

According to embodiments of the disclosure, which permit reduction in the size of a memory block, the speed of an erase operation may be increased, and parasitic capacitance between cell strings and row lines may be reduced, thereby contributing to improving the performance of a memory device.

Figure 9:
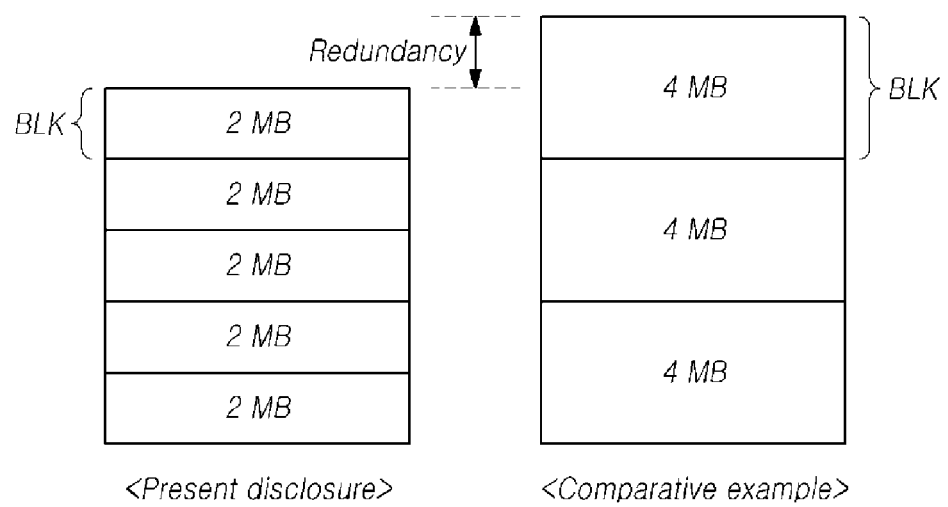
FIG. 9 is a representation of a diagram to assist in the explanation of effects of embodiments of the disclosure.

FIG. 9 is a representation of a diagram to assist in the explanation of effects of embodiments of the disclosure.

Referring to FIG. 9, according to embodiments of the disclosure, a memory block BLK may be configured to have a capacity corresponding to half of the capacity of a memory block BLK according to the comparative example described above with reference to FIG. 8. For example, if the memory block BLK according to the comparative example has a capacity of 4 MB, then the memory block BLK according to the embodiments of the disclosure may have a capacity of 2 MB.

In an example, assuming that a 10 MB product is fabricated, according to the comparative example, three memory blocks are required to fabricate the product. In this case, capacity becomes 12 MB, and a redundancy memory of 2 MB exceeding target capacity of 10 MB is formed, which may unnecessarily increase a chip size. On the other hand, according to the embodiments of the disclosure, because a memory block is configured to have smaller capacity of 2 MB, it is possible to fabricate the product in conformity with target capacity using five memory blocks, without a redundancy memory. Accordingly, an unnecessary increase in chip size may be prevented, thereby contributing to a reduction in chip size.

Figure 10:
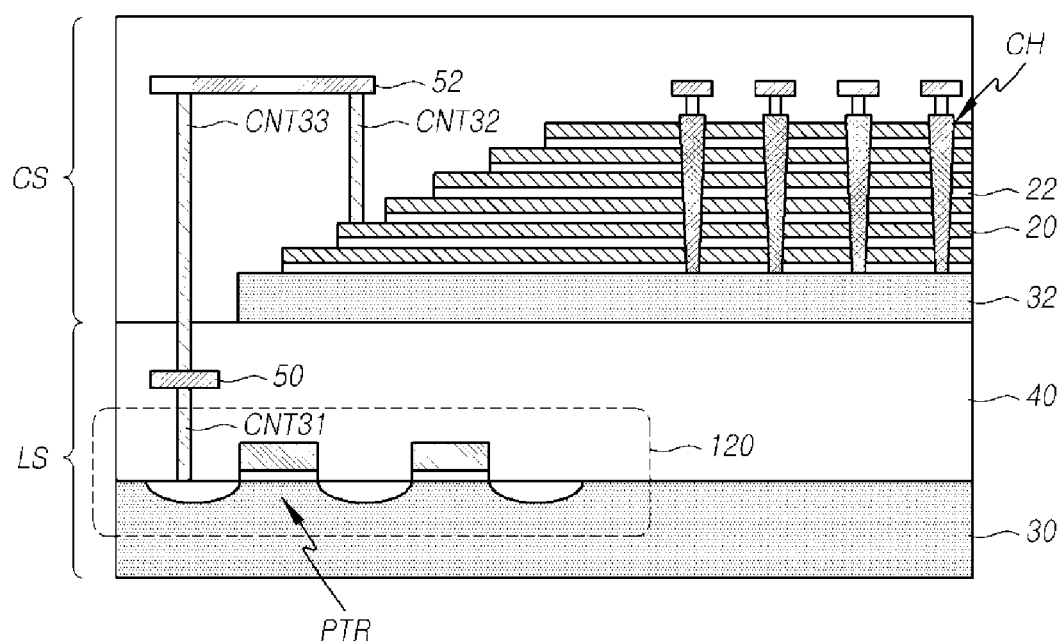
FIGS. 10 and 11 are cross-sectional views illustrating representations of examples of memory devices in accordance with embodiments of the disclosure.

FIG. 10 is a cross-sectional view illustrating a representation of a memory device in accordance with an embodiment of the disclosure.

Referring to FIG. 10, the memory device may include a memory structure CS and a logic structure LS, which is disposed under the memory structure CS. In this case, the memory device may be defined as having a PUC (peri under cell) structure.

The logic structure LS may include a first substrate 30, and the memory structure CS may include a second substrate 32. The first substrate 30 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The second substrate 32 may be configured by a polysilicon layer. Unlike the first substrate 30, which may use a monocrystalline silicon layer, the second substrate 32 may be configured by a polysilicon layer because the second substrate 32 should be formed on a dielectric layer 40 of the logic structure LS.

The logic structure LS may include a row decoder 120. Transistors PTR illustrated in FIG. 10 represent pass transistors that configure the row decoder 120. The pass transistors PTR may be laid out as described above with reference to FIGS. 4 to 7. Although not illustrated, the logic structure LS may further include a page buffer circuit (130 of FIG. 1) and a peripheral circuit (140 of FIG. 1).

The dielectric layer 40 may be defined on the first substrate 30 to cover the pass transistors PTR. The dielectric layer 40 may include silicon oxide, for example, HDP (high density plasma) oxide or TEOS (tetra-ethyl-ortho-silicate) oxide. A wiring line 50 may be defined in the dielectric layer 40. A contact CNT31, which passes through the dielectric layer 40, may be defined under the wiring line 50 to couple the wiring line 50 and the pass transistor PTR.

The memory structure CS may include a plurality of electrode layers 20 and a plurality of interlayer dielectric layers 22 that are alternately stacked on the second substrate 32, and a plurality of vertical channels CH that pass through the alternately stacked electrode layers 20 and interlayer dielectric layers 22. The electrode layers 20, the interlayer dielectric layers 22 and the vertical channels CH are described above with reference to FIG. 3, and therefore repeated description for the same components will be omitted here.

As the electrode layers 20 are staggered with one another in a region, a staircase structure may be formed. A wiring line 52 may be disposed over the staircase structure. The wiring line 52 may be coupled to one of the electrode layers 20 through a contact CNT32. The wiring line 52 may be coupled to the wiring line 50 through a contact CNT33. The electrode layer 20 may be coupled to the pass transistor PTR through the contacts CNT31 to CNT33 and the wiring lines 50 and 52. The contacts CNT31 to CNT33 and the wiring lines 50 and 52 may configure an electrical path, which couples one of the electrode layers 20 and a pass transistor PTR corresponding thereto.

Figure 11:
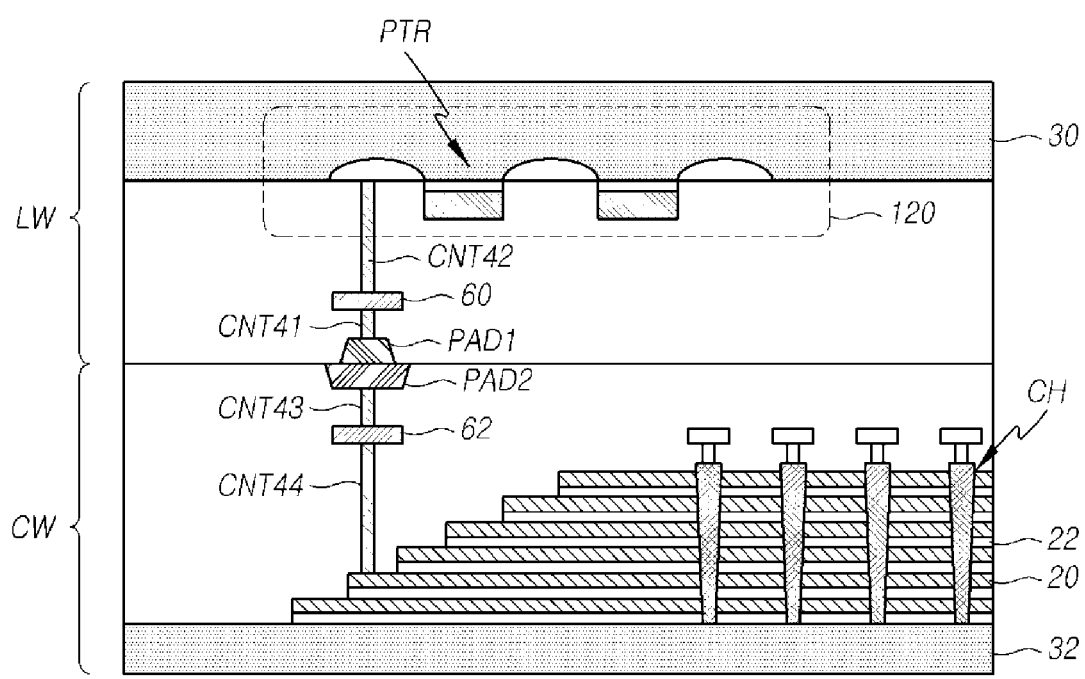

FIG. 11 is a cross-sectional view illustrating a representation of a memory device in accordance with an embodiment of the disclosure.

Referring to FIG. 11, a memory device may include a cell wafer CW and a logic wafer LW, which is bonded onto the cell wafer CW. In this case, the memory device may be defined as having a POC (peri over cell) structure.

The cell wafer CW and the logic wafer LW may be individually fabricated, and then may be bonded to each other to be coupled into one. The logic wafer LW may include a first substrate 30. The cell wafer CW may include a second substrate 32. The first substrate 30 and the second substrate 32 may be made of the same material. Each of the first substrate 30 and the second substrate 32 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

The logic wafer LW may include a plurality of pass transistors PTR, which are defined on the first substrate 30. The cell wafer CW may include a plurality of electrode layers 20 and a plurality of interlayer dielectric layers 22 that are alternately stacked on the second substrate 32, and a plurality of vertical channels CH, which pass through the alternately stacked electrode layers 20 and interlayer dielectric layers 22.

A first pad PAD1 may be defined on one surface of the logic wafer LW, which is bonded to the cell wafer CW. The first pad PAD1 may be coupled to one of the pass transistors PTR through contacts CNT41 and CNT42 and a wiring line 60. A second pad PAD2 may be defined on one surface of the cell wafer CW, which is bonded to the logic wafer LW. The second pad PAD2 may be coupled to one of the electrode layers 20 through contacts CNT43 and CNT44 and a wiring line 62.

The one surface of the cell wafer CW and the one surface of the logic wafer LW may be bonded to each other such that the first pad PAD1 of the logic wafer LW and the second pad PAD2 of the cell wafer CW are coupled to each other. Accordingly, an electrical path that couples one of the electrode layers 20 of the cell wafer CW and a pass transistor PTR of the logic wafer LW corresponding thereto may be configured.

For the sake of simplicity in illustration, each of FIGS. 10 and 11 illustrates only one structure that couples one electrode layer 20 and one corresponding pass transistor PTR. However, it should be understood that a plurality of pass transistors PTR is configured to correspond respectively to the electrode layers 20, and the electrode layers 20 are coupled to corresponding pass transistors PTR respectively through different electrical paths.

Figure 12:
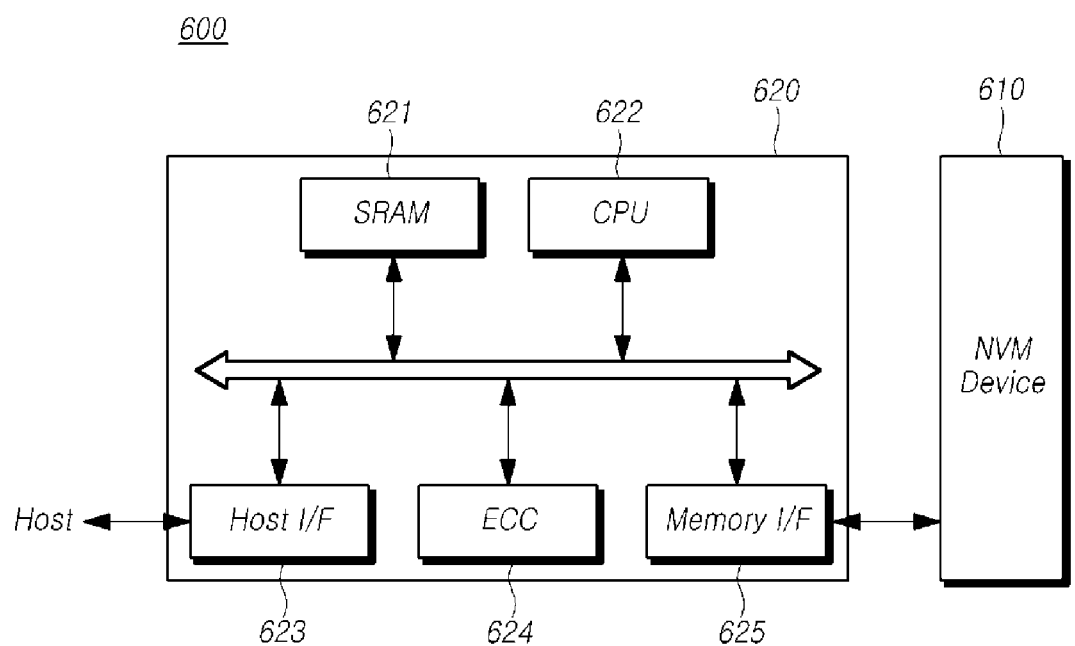
FIG. 12 is a block diagram schematically illustrating a memory system including a memory device in accordance with embodiments of the disclosure.

FIG. 12 is a block diagram schematically illustrating a memory system including a memory device in accordance with embodiments of the disclosure.

Referring to FIG. 12, a memory system 600 in accordance with an embodiment may include a nonvolatile memory device (NVM Device) 610 and a memory controller 620.

The nonvolatile memory device (NVM Device) 610 may be constituted by a memory device described above and may operate in the manner described above. The memory controller 620 may be configured to control the nonvolatile memory device (NVM Device) 610. The combination of the nonvolatile memory device (NVM Device) 610 and the memory controller 620 may be configured as a memory card or a solid state disk (SSD). An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device (NVM Device) 610.

A memory interface (MEMORY I/F) 625 interfaces with the nonvolatile memory device (NVM Device) 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, a SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 13:
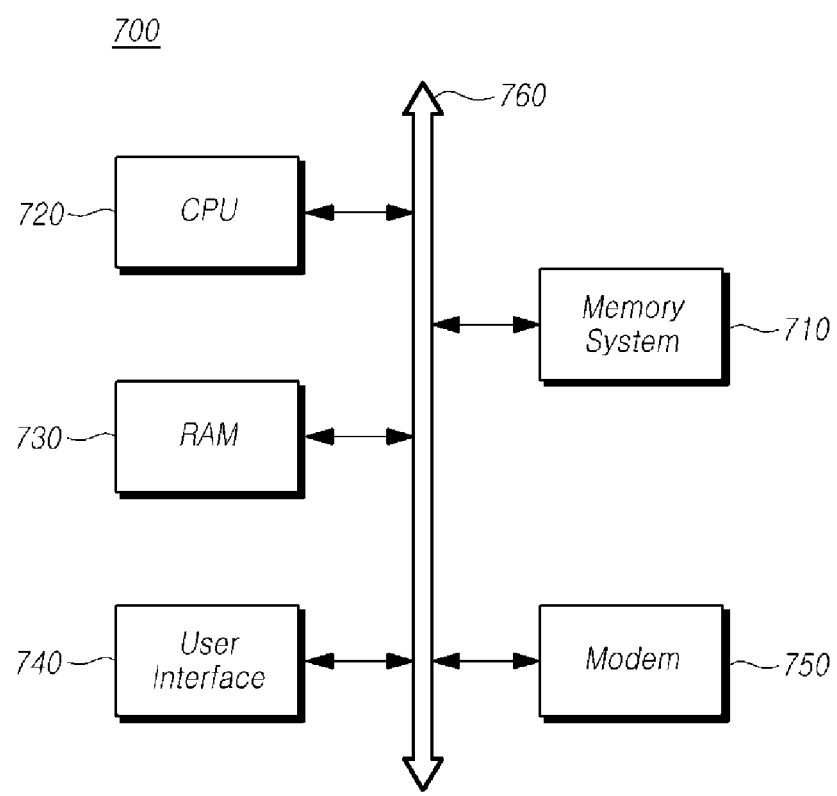
FIG. 13 is a block diagram schematically illustrating a computing system including a memory device in accordance with an embodiment of the disclosure.

FIG. 13 is a block diagram schematically illustrating a computing system including a memory device in accordance with an embodiment of the disclosure.

Referring to FIG. 13, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A memory device comprising:
   an active region with a drain;
   four memory blocks arranged in a first direction; and
   four pass transistors formed in the active region and sharing the drain, each one of the four pass transistors configured to transfer an operating voltage from the drain to a corresponding one of the four memory blocks in response to a block select signal,
   wherein the four pass transistors comprise two first pass transistors and two second pass transistors, and a channel length direction of the two first pass transistors and a channel length direction of the two second pass transistors are different from each other,
   wherein the channel length direction of the two first pass transistors is the first direction, and the channel length direction of the two second pass transistors is a second direction that intersects with the first direction, and
   wherein the four memory blocks are disposed within the greatest distance between the two first pass transistors measured in the first direction.

2. The memory device of claim 1, wherein the second direction is a direction that perpendicularly intersects with the first direction.

3. The memory device of claim 2, wherein
   the pitch of the four memory blocks in the first direction is one-quarter of (¼) of the greatest distance between the two first pass transistors measured in the first direction.

4. The memory device of claim 1, wherein the four pass transistors are disposed within the greatest distance between the two first pass transistors measured in the first direction.

5. The memory device of claim 1, wherein each of the four memory blocks comprises:
a plurality of electrode layers stacked on a substrate to be spaced apart from one another; and
a plurality of vertical channels passing through the plurality of electrode layers.

6. The memory device of claim 1, wherein the four memory blocks and the four pass transistors are disposed on a single substrate.

7. The memory device of claim 1, wherein the four pass transistors are included in a logic structure, and the four memory blocks are included in a cell structure that is formed on the logic structure.

8. The memory device of claim 1, wherein
the four pass transistors are included in a logic wafer, and the four memory blocks are included in a cell wafer that is bonded to the logic wafer,
the four pass transistors are coupled to a four first bonding pads, respectively, which are defined on one surface of the logic wafer bonded to the cell wafer,
the four memory blocks are coupled to a four second bonding pads, respectively, which are defined on one surface of the cell wafer bonded to the logic wafer, and
the four first bonding pads and the four second bonding pads are coupled in correspondence to each other.

9. A memory device comprising:
four memory blocks arranged in a first direction; and
four pass transistors configured to selectively transfer an operating voltage to any one of the four memory blocks in response to a block select signal,
the four pass transistors comprising:
first to fourth gates formed on extended portions, respectively, of a cross-shaped active region that extends in the first direction and in a second direction intersecting with the first direction;
a drain formed in a center portion of the active region that is surrounded by the first to fourth gates and that is configured to receive the operating voltage; and
first to fourth sources formed in end portions, respectively, of the extended portions of the active region and coupled to the memory blocks respectively corresponding thereto, and configured to output the operating voltage to the corresponding memory blocks,
wherein channel length direction of two pass transistors among the four pass transistors is the first direction, and channel length direction of the other two pass transistors among the four pass transistors is a second direction that intersects with the first direction, and
the four memory blocks are disposed within the greatest distance between the two pass transistors measured in the first direction.

10. The memory device of claim 9, wherein the second direction is a direction that perpendicularly intersects with the first direction.

11. The memory device of claim 9, wherein one global row line is coupled to the drain through a contact.

12. The memory device of claim 9, wherein the four memory blocks and the four pass transistors are disposed on a single substrate.

13. The memory device of claim 9, wherein the four pass transistors are included in a logic structure, and the four memory blocks are included in a cell structure that is formed on the logic structure.

14. The memory device of claim 9, wherein
the four pass transistors are included in a logic wafer, and the four memory blocks are included in a cell wafer that is bonded to the logic wafer,
the four pass transistors are coupled to four first bonding pads, respectively, which are defined on one surface of the logic wafer bonded to the cell wafer,
the four memory blocks are coupled to four second bonding pads, respectively, which are defined on one surface of the cell wafer bonded to the logic wafer, and
the first bonding pads and the second bonding pads are coupled in correspondence to each other.

15. A memory device comprising:
a substrate;
four pass transistors defined on the substrate, and including a common drain, four gates that are disposed around the common drain and four sources that are disposed opposite the common drain with respect to the four gates; and
four memory blocks connected to the four pass transistors, respectively,
wherein the four pass transistors are configured in one active region, which is defined in the substrate,
wherein channel length direction of two pass transistors among the four pass transistors is a first direction, and channel length direction of the other two pass transistors among the four pass transistors is a second direction that intersects with the first direction, and
wherein the four memory blocks connected to the four pass transistors are disposed within the greatest distance between the two pass transistors measured in the first direction.

16. The memory device of claim 15,
wherein the four memory blocks and the four pass transistors are disposed on a single substrate.

17. The memory device of claim 15,
wherein the four pass transistors are included in a logic structure, and the four memory blocks are included in a cell structure, which is formed on the logic structure.

18. The memory device of claim 15,
wherein the four pass transistors are included in a logic wafer, and the four memory blocks are included in a cell wafer that is bonded to the logic wafer,
wherein the four pass transistors are coupled to four first bonding pads, respectively, which are defined on one surface of the logic wafer bonded to the cell wafer,
wherein the four memory blocks are coupled to four second bonding pads, respectively, which are defined on one surface of the cell wafer bonded to the logic wafer, and
wherein the four first bonding pads and the four second bonding pads are coupled in correspondence to each other.

* * * * *